United States Patent
Nguyen et al.

[11] Patent Number: 5,821,169
[45] Date of Patent: Oct. 13, 1998

[54] HARD MASK METHOD FOR TRANSFERRING A MULTI-LEVEL PHOTORESIST PATTERN

[75] Inventors: Tue Nguyen; Chien-Hsiung Peng, both of Vancouver, Wash.; Bruce Dale Ulrich, Beaverton, Oreg.

[73] Assignees: Sharp Microelectronics Technology,Inc., Camas, Wash.; Sharp Kabushiki Kaisha, Osaka, Japan

[21] Appl. No.: 692,379

[22] Filed: Aug. 5, 1996

[51] Int. Cl.$^6$ .............................. H01L 21/00; B44C 1/22
[52] U.S. Cl. ........................ 438/736; 438/738; 216/41; 216/51; 156/345
[58] Field of Search .................. 216/41, 51; 438/723, 438/734, 736, 738, 743, 744; 156/345

[56] References Cited

U.S. PATENT DOCUMENTS

| | | | |
|---|---|---|---|
| 4,916,511 | 4/1990 | Douglas | 357/23.6 |
| 5,091,339 | 2/1992 | Carey | 437/187 |
| 5,173,442 | 12/1992 | Carey | 437/173 |
| 5,264,076 | 11/1993 | Cuthbert et al. | 156/657 |
| 5,346,586 | 9/1994 | Keller | 156/656 |
| 5,466,639 | 11/1995 | Ireland | 437/195 |
| 5,468,342 | 11/1995 | Nulty et al. | 156/643.1 |
| 5,567,334 | 10/1996 | Baker et al. | 216/41 X |
| 5,632,908 | 5/1997 | Shahid | 216/41 X |

*Primary Examiner*—William Powell
*Attorney, Agent, or Firm*—Gerald Maliszewski; David C. Ripma

[57] ABSTRACT

A method is provided for forming intermediate levels in an integrated circuit dielectric during a damascene process using a hard mask layer to transfer the pattern of a photoresist mask having at least one intermediate thickness. The dielectric is covered with a hard mask layer, and the hard mask layer is covered with the photoresist mask. The photoresist mask pattern is transferred into the hard mask pattern so that the hard mask pattern has at least one intermediate thickness. The method forms an interconnect to a first depth in the dielectric through an opening in the hard mask pattern. The hard mask pattern is partially etched away in the area of the intermediate thickness to reveal a second dielectric surface area. The second dielectric surface area is etched to a second depth, less than the first depth. In this manner, vias can be formed to the first depth, and lines can be formed at a second depth to intersect the vias. The use of a relatively thin hard mask pattern reduces the degradation of vertical surface features, due to faceting, which generally occurs with the use of a thicker photoresist pattern. The method of the present invention allows a multi-level damascene process to be used to form features with relatively small geometries in the dielectric.

22 Claims, 15 Drawing Sheets

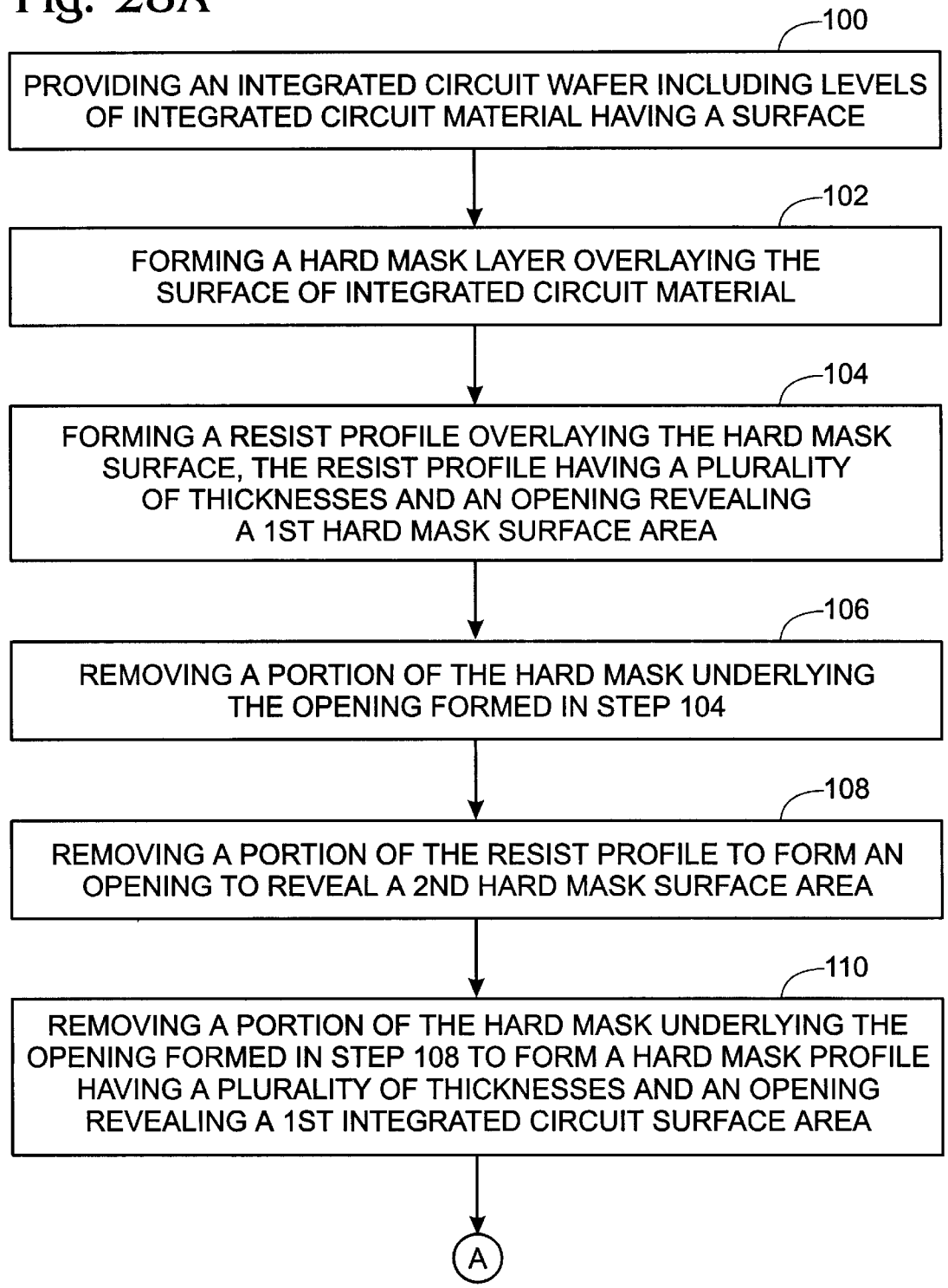

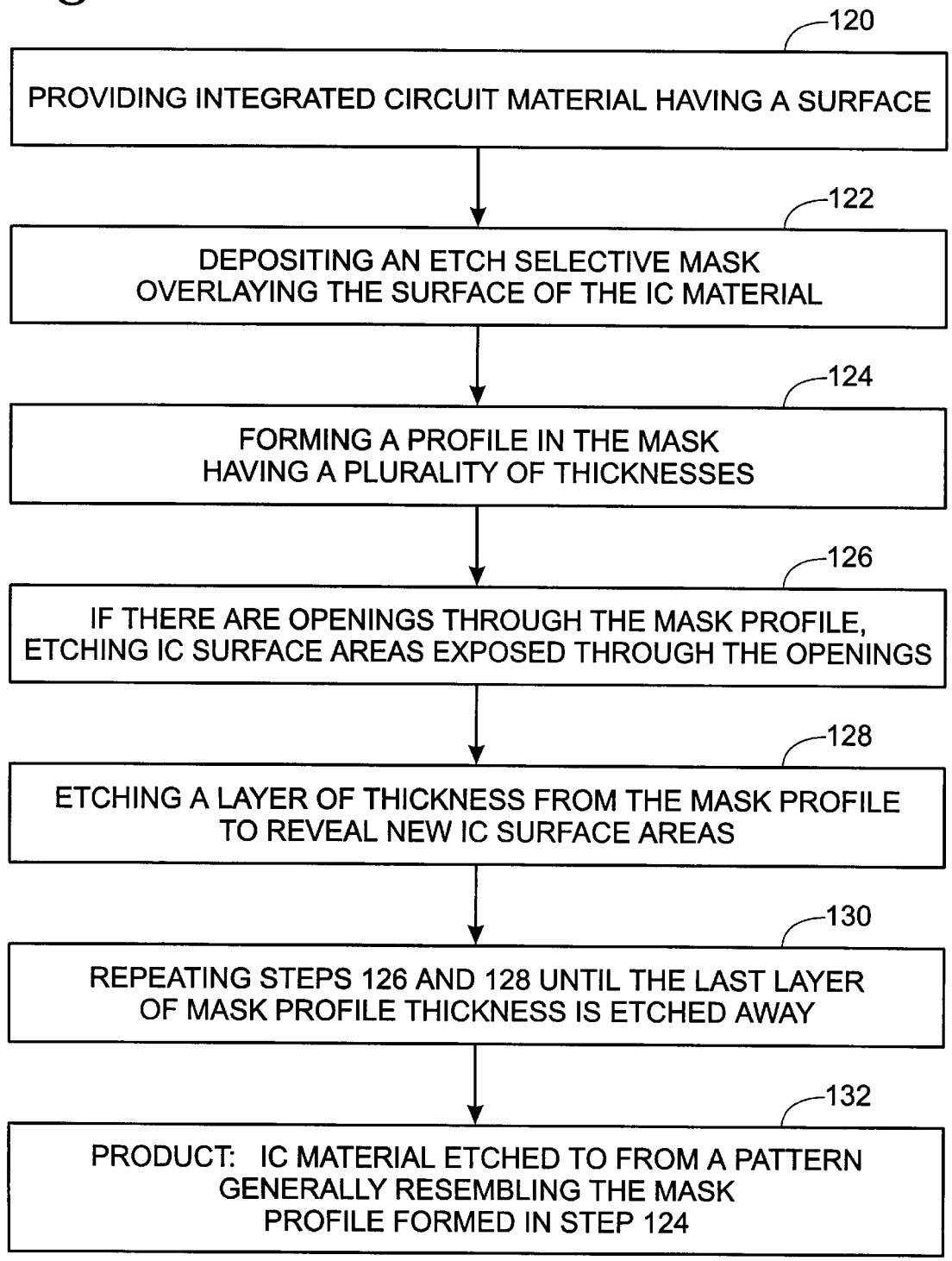

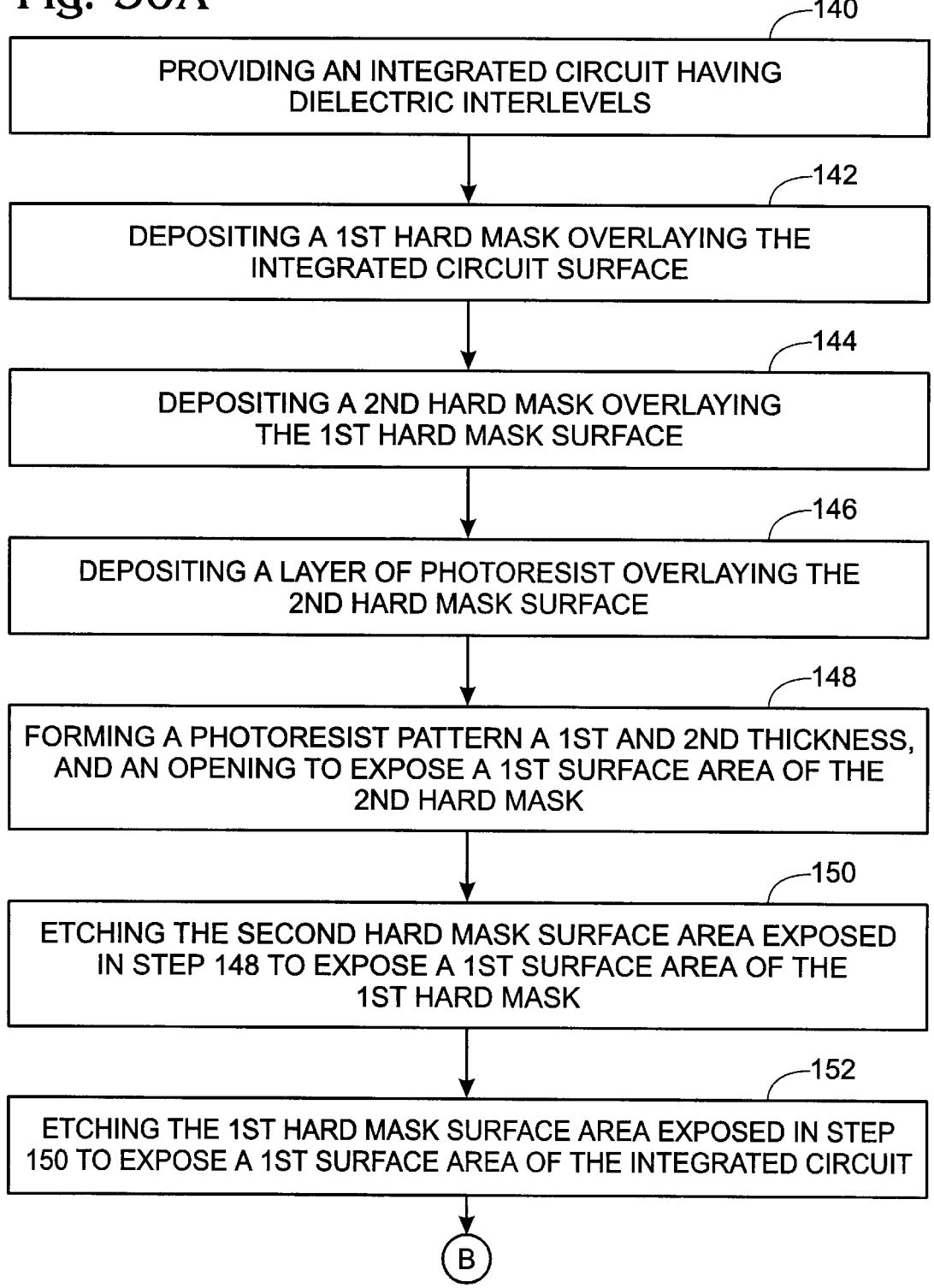

HARD MASK METHOD FOR TRANSFERRING A MULTI-LEVEL PHOTORESIST PATTERN

BACKGROUND AND SUMMARY OF THE INVENTION

This invention relates generally to integrated circuit processes and fabrication, and more particularly to a method of using a hard mask for transferring a multi-level photoresist pattern to an interlevel dielectric.

The demand for progressively smaller and more powerful electronic products, in turn, fuels the need for smaller geometry integrated circuits (ICs), and large substrates. It also creates a demand for a denser packaging of circuits onto IC substrates. The desire for smaller geometry IC circuits requires that the interconnections between components and dielectric layers be as small as possible. Therefore, research continues into reducing the width of via interconnects and connecting lines. Copper is a natural choice to replace aluminum in the effort to reduce the size of lines and vias in an electrical circuit. The conductivity of copper is approximately twice that of aluminum and over three times that of tungsten. As a result, the same current can be carried through a copper line having half the cross-section of an aluminum line.

The electromigration characteristics of copper are also much superior to those of aluminum. Copper is approximately ten times better than aluminum with respect to electromigration. As a result, a copper line, even one having a much smaller width than aluminum line, is better able to maintain electrical continuity.

There are problems associated with the use of copper, however, in IC processing. Copper pollutes many of the materials used in IC processes and, therefore, care must be taken to keep copper from migrating. In addition, copper is especially prone to oxidation, especially during processes using an oxygen gas. Care must be take to protect copper from exposure during etch processes, annealing, and processes requiring high temperature because the oxidation products of copper are difficult to clean.

New deposition techniques have been developed for use in filling the small vias, lines, and interconnects required in modern IC design and processing. It is impractical to sputter metal, either copper or aluminum, to fill small diameter vias due to the poor gap filling characteristics of most metals. To deposit copper into small vias a chemical vapor deposition (CVD) technique has been developed. However, even with the CVD technique, copper remains a problem to remove with conventional etch processes. The low volatility of copper etch products require copper to be removed (vaporized) at high temperatures, approximately 250° C., which is destructive to photoresist masks. The use of a plasma etch to remove copper often results in undesirable oxidation products. Wet etches are isotropic, and so, too imprecise for many applications. Therefore, the IC processing industry has developed a process to form a via using CVD without etching the copper. The method is called the inlay, or damascene, process.

The damascene method for forming a via between a substrate surface and an overlying dielectric surface is described below. The underlying substrate surface is first completely covered with a dielectric, such as oxide. A patterned photoresist profile is then formed over the oxide. The resist profile has an opening, or hole, in the photoresist corresponding to the area in the oxide where the via is to be formed. Other areas of the oxide to be left in place are covered with photoresist. The photoresist covered dielectric is then etched to remove oxide underlying the hole in the photoresist. After stripping the photoresist away, CVD copper is used to fill the via. A layer consisting of oxide with a copper via through it now overlies the substrate surface. The excess copper remaining is removed with a chemical mechanical polish (CMP) process, as is well known in the art.

Since the damascene processing method is relatively new to the IC industry, refinements in the technique are ongoing. One refinement is the dual damascene method. In the dual damascene method vias, interconnects, and lines are formed in a dielectric at two different levels. In terms of the example of the damascene process in the preceding paragraph, the dual damascene process adds a second via, or interconnecting line, in the deposited oxide at an interlevel depth different from the depth of the first via. That is, vias (or interconnects) are formed to two different interlevels in the oxide.

One known method of performing the dual damascene process is through multiple photoresist mask and etch steps. A single level photoresist profile is formed on a layer deposited dielectric and a via pattern is formed by etching to a predetermined interlevel in the dielectric material. At this point in the process the via is only partially etched. The photoresist is then stripped and a second single layer photoresist profile is formed on the dielectric surface. The dielectric is etched to form an interconnect pattern to a second interlevel in the dielectric material. Coincident with etching the interconnect, the via formed in the first dielectric etch step is further etched such that it contacts connection areas in the underlying substrate layer. Aligning the photoresist profiles is a problem using this method. If the two photoresist profiles are not aligned correctly, intersecting features in the dielectric material will be misaligned. That is, a conductive line associated with the first photoresist pattern may not correctly intersect a via associated with the second photoresist profile. Alignment errors can be corrected by making the intersecting features oversized, but this takes away from the overall goal of reducing the size of connecting lines and vias. Alignment problems reduce yields, and increase cost and the complexity of IC processes.

A dual damascene method using a multi-level photoresist profile, called the multi-level damascene method, avoids the alignment problems associated with using multiple single-level resist masks described above. The process is described in co-pending application Ser. No. 08/665,014, filed Jun. 10, 1996, entitled "Method for Transferring a Multi-level Photoresist Pattern", invented by Tue Nguyen, Sheng Teng Hsu, Jer-Shen Maa, Chien-Hsiung Peng, and Bruce Dale Ulrich, Docket No. SMT 162. The formation of a multi-level photoresist pattern suitable for use with the multi-level damascene process is disclosed in co-pending application Ser. No. 08/665,013, filed Jun. 10, 1996, now U.S. Pat. No. 5,753,417, entitled "Multiple Exposure Masking System For Forming Multi-Level Resist Profiles", invented by Bruce Dale Ulrich, Docket No. SMT 234. A reticle to form a multi-level photoresist pattern suitable for use with the present invention is disclosed in co-pending application Ser. No. 08/660,870, filed Jun. 10, 1996, entitled "Multi-Level Reticle System and Method for Forming Resist Profiles", invented by David Russell Evans, Tue Nguyen, and Bruce Dale Ulrich, Docket No. SMT 166. All three, above mentioned, applications are assigned to the same assignees as the instant application.

Faceting is a problem associated with the etching of IC interlevel dielectric material by ion bombardment or plasma flow. Degraded vertical surfaces in the interlevel dielectric are often, at least partially, caused by facets formed in the photoresist profile used to etch the interlevel dielectric. Faceting is the formation of a facet, or vertical sidewall with an angle of less than 90°, as measured from the horizontal plane. The corners of the vertical feature, such as the wall of a trench or via to be transferred into an interlevel dielectric, initially become faceted because perfectly square features are difficult to form. The facet grows from the corner as the photoresist undergoes ion bombardment. Photoresist material is more easily removed by ion bombardment at angles incident to the photoresist surface, as opposed to ions flowing at the same angle, or parallel, to the surface. For this reason, the facet on the corner continues to develop as the vertical portion of the sidewall remains vertical. The facet develops at an angle based on the relationship between the resist surface and the direction of ion flow. A facet is generally formed at the angle most likely to promote the continued removal of resist. The relationship between the angle and the etch rate is called the sputtering yield. The sputtering yield varies according to material, environment, and energy levels as is well known in the art.

A facet that continues to develop, until the underlying dielectric is exposed, allows the dielectric to be directly degraded. The exposed dielectric surface is unintentionally bombarded with ions, and etched, during the dielectric etch process. The photoresist profile must be made relatively thick to prevent the direct transfer of a facet to the dielectric, during a resist etch process. A multi-level resist profile must be even thicker to undergo multiple photoresist and interlevel dielectric etch steps, such as required in a multi-level damascene process, or in a transfer of a relatively deep via into an interlevel dielectric.

Even if the resist is thick enough to protect from the direct transfer of a facet to the dielectric, faceted surfaces of the resist can be indirectly transferred into the dielectric. Since the etch selectivity between the dielectric and the resist is not high, resist material is unintentionally removed during a dielectric etch. Faceted resist edges can be thin enough to be completely etched away during a dielectric etch, exposing dielectric surfaces. The exposed dielectric surfaces are then unintentionally etched. In this manner, the facet is transferred from resist to dielectric. Faceting occurs on the vertical features of dielectric material, in a manner similar to photoresist, during an ion etch process. The degradation of vertical sidewalls in the interlevel dielectric is compounded when the faceted edges of the resist mask are transferred into the dielectric. That is, the effects of faceting in the dielectric are much worse if the dielectric etch process begins with faceted edges transferred from the resist.

Photoresist can be deposited in thicker layers over the dielectric to protect against the indirect transfer of resist facets to the dielectric. A small facet, relative to the size of the entire vertical sidewall, is generally not be transferred. By making the photoresist thicker the proportional size of the facet to the total sidewall is reduced. However, using relatively thick layers of photoresist can cause another serious problem, microloading. Microloading is the unequal etch rate of different sized features in the photoresist. That is, microloading accounts for the difference in the amount of material etched from a large feature, such as a trench, as compared to a small feature, such as a narrow via, during the same etch process. The etch rate differences result from the materials to be etched, the etch environment, and energy levels as is well known in the art. Microloading causes unequal penetration into the resist. The unintended differences in etch depth of different sized features in the resist can be transferred into the dielectric. To minimize the effects of microloading it is desirable to use a thin layer of resist. Therefore, the process Engineer is faced with the dilemma of choosing a thick layer of resist to reduce the direct and indirect effects of faceting, or a thin layer of resist to reduce the effects of microloading.

The faceting effect is depicted in FIGS. 1a–1e, and is explained in greater detail in the Detailed Description of the Preferred Embodiment section, below.

Hard mask layers, used as an intermediate medium, have been used to alleviate some of the effects of faceting in the transfer of a photoresist pattern to an interlevel dielectric. The term hard mask, as used herein, generally refers to a material having a high etch selectively relative to an adjoining IC material. Nulty et al., U.S. Pat. No. 5,468,342, and Keller, U.S. Pat. No. 5,346,586, disclose methods of using a hard mask profile to improve the trench and via wall profiles etched into an interlevel dielectric. The interlevel dielectric is covered with a hard mask, and then, the hard mask layer is covered with a photoresist layer. After the photoresist profile is formed, it is used to etch the hard mask to form a hard mask profile. The hard mask profile generally replicates the photoresist profile. After removing the photoresist, the hard mask profile is used to etch the dielectric. High etch selectivity between the dielectric material and the hard mask reduces unintended etching of the mask profile as the interlevel dielectric is etched. In this manner, facets, in both the profile and the interlevel dielectric, are minimized.

It would be advantageous to employ a method of forming vias and interconnects to at least two different interlevels beneath the surface of an IC dielectric to perform a damascene process without the requirement of aligning a series of single-level photoresist or hard masks.

It would be advantageous to use a multi-level mask with a relatively small thickness for use in etching into the interlevel dielectric of an integrated circuit, since a relatively thin mask decreases the susceptibility of the mask to microloading.

It would be advantageous to use a multi-level mask having a high etch selectivity, compared to the interlevel dielectric, to decrease the susceptibility of the interlevel dielectric to faceting. It would be desirable if the thin, etch selective, hard mask was selected from typical IC materials.

Accordingly, an integrated circuit wafer including levels of integrated circuit material having a surface is provided. The method of forming electrical interconnections from the surface to a plurality of interlevels in the integrated circuit material comprises the steps of; forming a hard mask layer of a predetermined thickness overlying the surface of the integrated circuit material, the hard mask having a surface; forming a resist profile overlying the hard mask surface, the resist profile having a plurality of predetermined thicknesses, and the resist profile having an opening through the resist profile revealing a first predetermined hard mask surface area; removing a portion of the hard mask layer underlying the opening in the resist profile formed above; removing a predetermined portion of the resist profile to form an opening revealing a second predetermined hard mask surface area; removing a portion of the hard mask layer underlying the opening formed above to form a hard mask profile having a plurality of predetermined thicknesses and an opening through the hard mask to reveal a first predetermined integrated circuit surface area; removing integrated circuit material underlying the opening in the hard mask profile formed above, removing a predetermined portion of the hard mask profile to form an opening revealing a second predetermined integrated circuit surface; removing integrated circuit material underlying the opening formed above, whereby integrated circuit material is removed to generally reproduce the shape of the overlying resist profile.

In the preferred form of the invention the hard mask thickness is less than ½ of the distance between the integrated circuit surface and the interlevel furthest from the integrated circuit surface. Also, the etch selectivity of the hard mask to the integrated circuit material is higher than 4 to 1.

In one embodiment of the invention the hard mask is formed in a plurality of layers using at least two hard mask materials, with each hard mask layer having a predetermined thickness, and the materials of adjoining layers having different etch selectivities, whereby the hard mask profile is formed through removal of hard mask layers in separate etch processes.

BRIEF DESCRIPTION OF THE DRAWINGS

FIG. 29 is a flow diagram illustrating the steps of the method of the present invention for etching integrated circuit material.

DETAILED DESCRIPTION OF THE PREFERRED EMBODIMENT

Figure 1A:
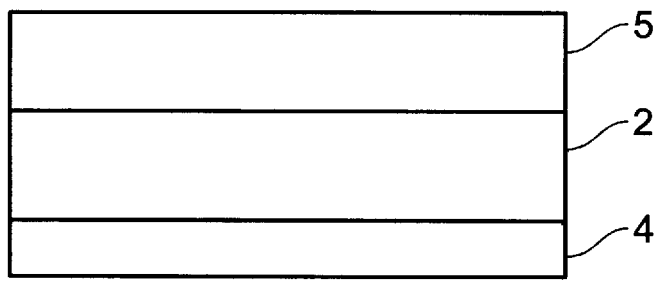
FIG. 1a is a partial cross-sectional view of an IC interlevel dielectric overlying a substrate, and a layer of photoresist overlying the interlevel dielectric.

FIGS. 1a–1e depict the phenomena of faceting, which is addressed by the present invention. FIG. 1a is a partial cross-sectional view of an IC interlevel dielectric 2 overlying a substrate 4, and a layer of photoresist 5 overlying interlevel dielectric 2. Substrate 4 is typically a silicon material, while interlevel dielectric 2 typically an oxide. The first step in a commercial etch process is to cover interlevel dielectric 2 with a layer of photoresist 5.

Figure 1B:
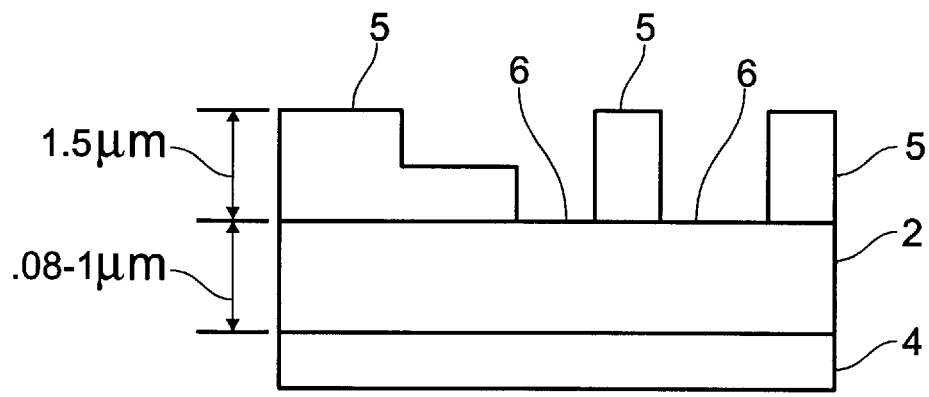
FIG. 1b is a partial cross-sectional view of the IC interlevel dielectric of FIG. 1a with a multi-level profile formed in the photoresist and an opening to reveal a first dielectric surface area.

FIG. 1b is a partial cross-sectional view of IC interlevel dielectric 2 of FIG. 1a with a multi-level profile formed in photoresist 5 and an opening to reveal a first dielectric surface area 6. Photoresist layer 5 is patterned through exposure to light through a reticle. The formation of a multi-level photoresist profile can be formed with a multi-level reticle. As mentioned earlier, the formation of multi-level resist profiles is the subject of a co-pending patent application, "Multi-level Reticle System and Method for the Forming Multi-Level Resist Profiles", Ser. No. 08/660,870. Bilevel resist profile 5 has a predetermined thickness, thick enough to prevent the direct transfer of facets, as explained in the Background and Summary of the Invention section above, from resist 5 into dielectric 2. However, as will be seen in FIGS. 1c–1e, resist 5 is not thick enough to prevent the indirect transfer of facets into dielectric 2 from resist 5. Resist 5 must withstand two separate etch steps into interlevel dielectric 2, and one step of resist 5 partial removal, before the process is complete. In FIG. 1b, interlevel dielectric 2 is approximately 0.8 to 1 microns thick (in the vertical dimension), while resist 5 is approximately 1.5 microns thick.

Figure 1C:
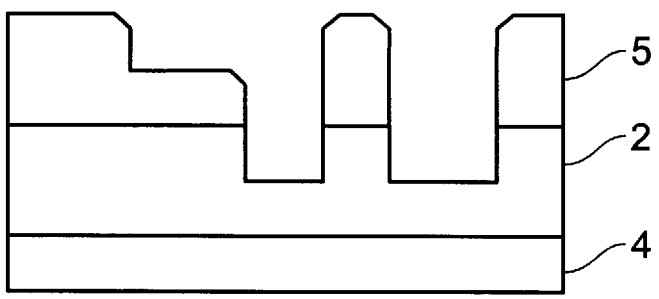
FIG. 1c is a partial cross-sectional view of the IC interlevel dielectric of FIG. 1b with the first surface area of the interlevel dielectric, underlying the opening in the photoresist, removed.

FIG. 1c is a partial cross-sectional view of IC interlevel dielectric 2 of FIG. 1b with first surface area 6 of interlevel dielectric 2, underlying the opening in photoresist 5, removed. The process of etching interlevel dielectric 2 to a plurality of levels with a multi-level resist profile is described in the co-pending application mentioned above, "Method for Transferring a Multi-Level Photoresist Pattern", Ser. No. 08/665,014. The edges of resist 5 show the early effects of faceting. The etch selectivity between interlevel dielectric 2 and resist 5 is not high, approximately 3:1. As dielectric 2 is intentionally etched, resist 5 is unintentional etched to a lesser extent.

Figure 1D:
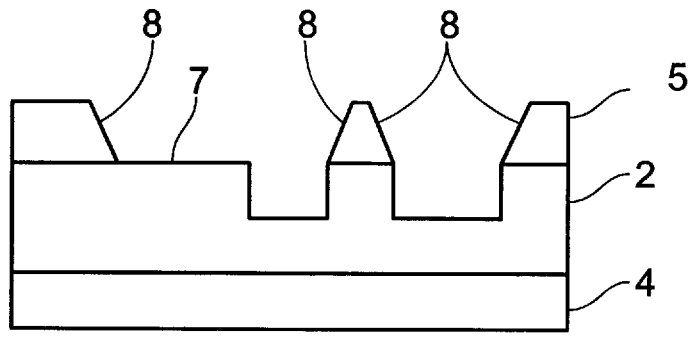
FIG. 1d is a partial cross-sectional view of the IC interlevel dielectric of FIG. 1c with a portion of the photoresist removed to reveal a second interlevel dielectric surface area.

FIG. 1d is a partial cross-sectional view of IC interlevel dielectric 2 of FIG. 1c with a portion of photoresist 5 removed to reveal a second interlevel dielectric surface area 7. The degraded edges 8 of resist 5 are a result of faceting. The faceting of resist 5, begun in FIG. 1c, continues to develop in FIG. 1d. At this step in the process resist 5 has withstood an unintentional interlevel dielectric etch (FIG. 1c) and an etch step to remove a layer of resist 5 (FIG. 1d).

Figure 1E:
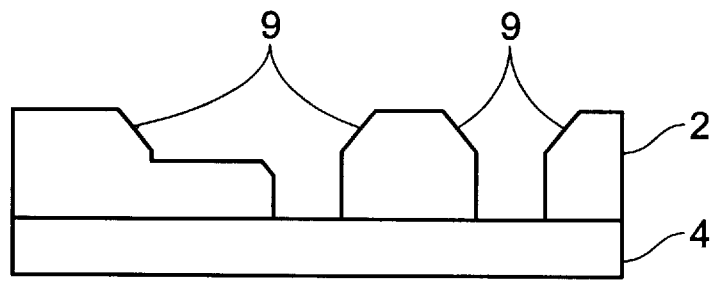
FIG. 1e is a partial cross-sectional view of the IC interlevel dielectric of FIG. 1d with dielectric removed to two interlevels, and displaying faceted edges.

FIG. 1e is a partial cross-sectional view of IC interlevel dielectric 2 of FIG. 1d with dielectric 2 removed to two interlevels, and displaying faceted edges 9. FIG. 1e depicts the results of the second interlevel dielectric etch, after the remainder of resist 5 is removed. Since the vertical surfaces of resist profile 5 have been previously degraded (faceted edges 8 in FIG. 1d), faceted edges 9 are indirectly formed in dielectric 2 as the remainder of resist 5 is etched away. Faceted edges 9 result in a dielectric via that is wider along the surface (previously) adjoining resist 5, than along the surface adjoining substrate 4. After being filled with a conductive material (not shown) such a degraded via may be wide enough to unintentionally electrically communicate to surrounding vias, electrical lines, and trenches. Such degradation, or faceting, defeats the purpose of forming narrow interconnections vias through interlevel dielectric 2.

Figure 2:
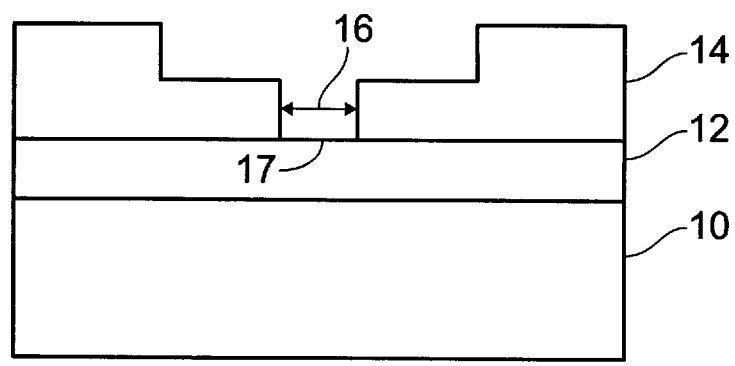
FIG. 2 is a partial cross-sectional view of an IC interlevel dielectric with an overlying hard mask layer, and a multi-level photoresist profile overlying the hard mask layer.

FIGS. 2–10 depict the formation of interlevel dielectric interconnections using the multi-level hard mask of the present invention. FIG. 2 is a partial cross-sectional view of an IC interlevel dielectric 10 with an overlying hard mask layer 12, and a multi-level photoresist profile 14 overlying hard mask layer 12. IC interlevel dielectric 10 is selected from a number of materials well known in the art, including oxide, and typically overlies a substrate layer (not shown). Hard mask 12 is selected from the group consisting of Silicon Nitride, Poly Silicon, Silicon Dioxide, Amorphous Silicon, and Boron Nitride. Alternately, hard mask 12 is a conductive material selected from the group consisting of Titanium Nitride, Titanium, Tungsten, and Conductive Oxides. The hard mask material is chosen to be etch selective with respect to the dielectric material it overlies. Photoresist profile 14 has two thicknesses and an opening 16 to reveal a first hard mask surface area 17.

Figure 3:
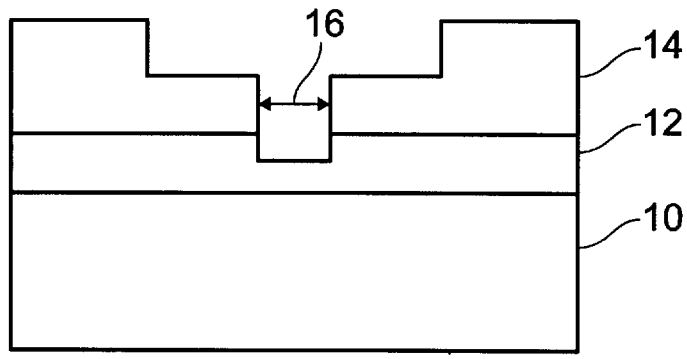
FIG. 3 is a partial cross-sectional view of the IC interlevel dielectric of FIG. 2 with the first surface area of the hard mask layer, underlying the opening in the resist profile, removed.

FIG. 3 is a partial cross-sectional view of IC interlevel dielectric 10 of FIG. 2 with first surface area 17 of hard mask layer 12, underlying opening 16 in resist profile 14, removed. Hard mask layer 12 is typically removed with an etchant selective to hard mask 12 as opposed to photoresist 14. That is, the etchant used to remove hard mask 12 has relatively little effect on photoresist 14.

Figure 4:
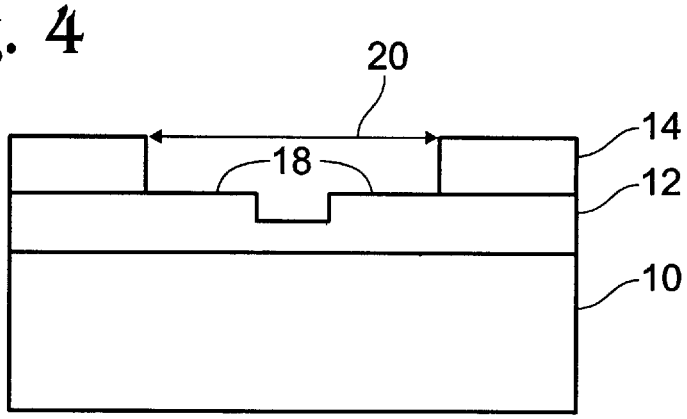
FIG. 4 is a partial cross-sectional view of the IC interlevel dielectric of FIG. 3 with a portion of the photoresist removed to reveal a second hard mask surface area.

FIG. 4 is a partial cross-sectional view of IC interlevel dielectric 10 of FIG. 3 with a portion of photoresist 14 removed to reveal a second hard mask surface area 18. The photoresist portion removed creates an opening 20 in photoresist 14 to reveal second surface area 18. The etchant used to remove photoresist 14 is highly selective to photoresist 14 as opposed to hard mask 12. That is, the etchant has relatively little affect on hard mask 12.

Figure 5:
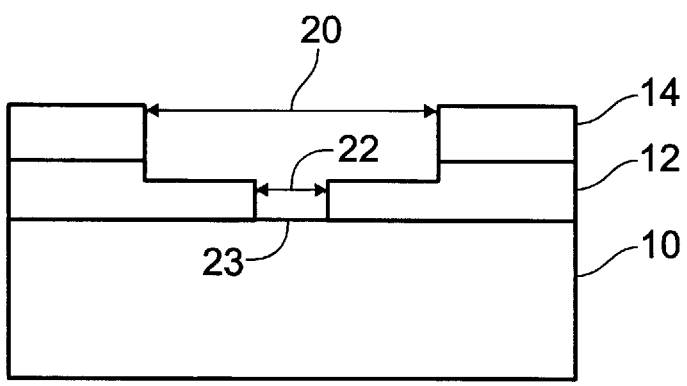
FIG. 5 is a partial cross-sectional view of the IC interlevel dielectric of FIG. 4 with the second surface area of the hard mask layer, underlying the opening in the photoresist profile, removed.

FIG. 5 is a partial cross-sectional view of IC interlevel dielectric 10 of FIG. 4 with second surface area 18 of hard mask layer 12, underlying opening 20 in the photoresist profile 14, removed. Hard mask layer 12 in the area underlying opening 16, as shown in FIG. 2, is further etched to form an opening 22 revealing a first IC interlevel dielectric surface area 23.

Figure 6:
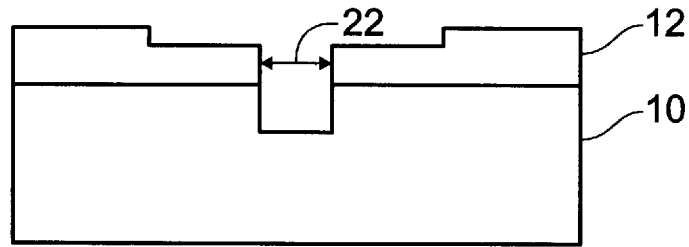
FIG. 6 is a partial cross-sectional view of the IC interlevel dielectric of FIG. 5 with the first surface area of the IC material, underlying the opening in the hard mask profile, removed.

FIG. 6 is a partial cross-sectional view of IC interlevel dielectric 10 of FIG. 5 with first surface area 23 of IC material 10, underlying opening 22 in hard mask profile 12, removed. An etchant is used that is highly selective to IC material 10 as opposed to hard mask layer 12.

Figure 7:
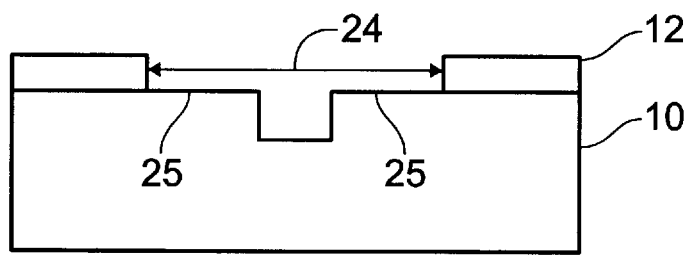
FIG. 7 is a partial cross-sectional view of the IC interlevel dielectric of FIG. 6 with a portion of the hard mask removed to create an opening in the hard mask layer.

FIG. 7 is a partial cross-sectional view of IC interlevel dielectric 10 of FIG. 6 with a portion of hard mask 12 to create an opening 24 in hard mask layer 12. Second IC interlevel dielectric surface area 25 is revealed through opening 24.

Figure 8:
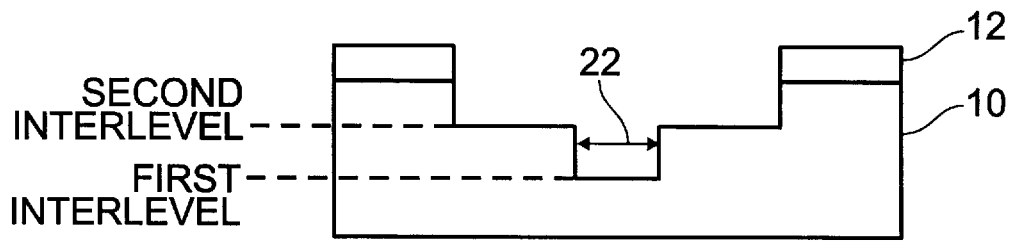
FIG. 8 is a partial cross-sectional view of the IC interlevel dielectric of FIG. 7 with the second surface area of the IC material, underlying the opening in the hard mask profile, removed.

FIG. 8 is a partial cross-sectional view of IC interlevel dielectric 10 of FIG. 7 with second surface area 25 of IC material 10, underlying opening 24 in hard mask profile 12, removed. IC material 10 is also removed to the first interlevel in the area underlying opening 22. Interlevel dielectric 10 is shown etched to two interlevels in FIG. 8.

Figure 9:
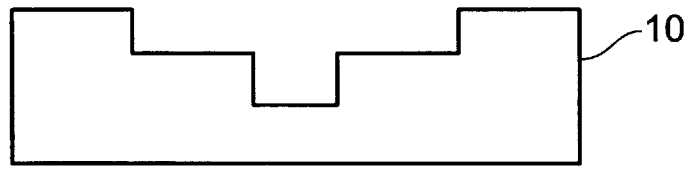
FIG. 9 is a partial cross-sectional view of the IC interlevel dielectric of FIG. 8 with the remaining hard mask profile, left overlying the surface of the IC interlevel dielectric, removed.

FIG. 9 is a partial cross-sectional view of IC interlevel dielectric 10 of FIG. 8 with remaining hard mask profile 12, left overlying the surface of IC interlevel dielectric 10, removed.

Figure 10:
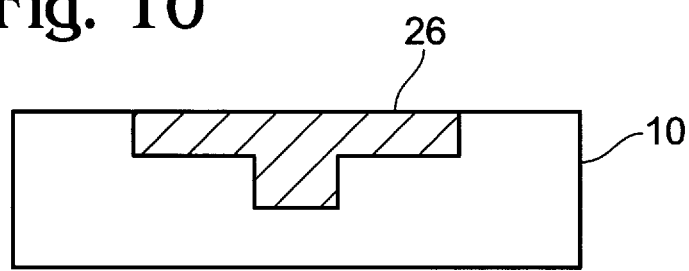
FIG. 10 is a partial cross-sectional view of the IC interlevel dielectric of FIG. 9 with conductive material deposited in the areas where IC material is removed.

FIG. 10 is a partial cross-sectional view of IC interlevel dielectric 10 of FIG. 9 with a conductive material 26 deposited in the areas where IC material 10 is removed. Conductive material 26 is used to form electrical interconnect vias and trenches from the surface of interlevel dielectric 10 to interlevels in IC material 10. After depositing conductive material 26, the surface of interlevel dielectric 10 is typically polished with a chemical mechanical process as is well known in the art to form a planar surface having a predetermined flatness. Conductive material 26 is selected from the group consisting of Copper, Tungsten, Aluminum, and Aluminum Alloys. In the preferred embodiment of the invention conductive material 26 is CVD Copper.

Figure 11:
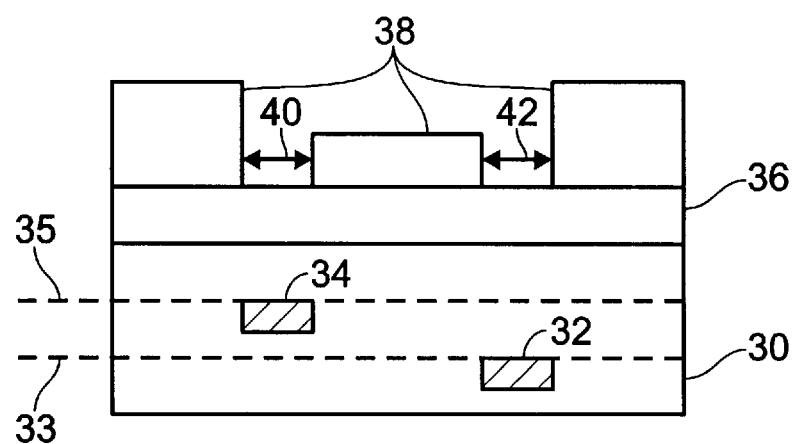
FIG. 11 is a partial cross-sectional view of an IC interlevel dielectric having a first connection area at a first interlevel, and a second connection area at a second interlevel.

FIGS. 11–18 depict the formation of interconnections to three interlevels in a dielectric using the multi-level hard mask of the present invention. FIG. 11 is a partial cross-sectional view of an IC interlevel dielectric 30 having a first connection area 32 at a first interlevel 33, and a second connection area 34 at a second interlevel 35. A hard mask layer 36 overlies dielectric 30, and a photoresist profile 38 overlies hard mask layer 36. Typically, connection areas 32 and 34 are conductive or semiconductive regions to be electrically interfaced to the surface of interlevel dielectric 30. As in FIGS. 2–10, photoresist profile 38 has two thicknesses, although the process works in the same manner with three or more thicknesses. Photoresist profile 38 has a first opening 40 and a second opening 42 to reveal first hard mask layer surface areas 43.

Figure 12:
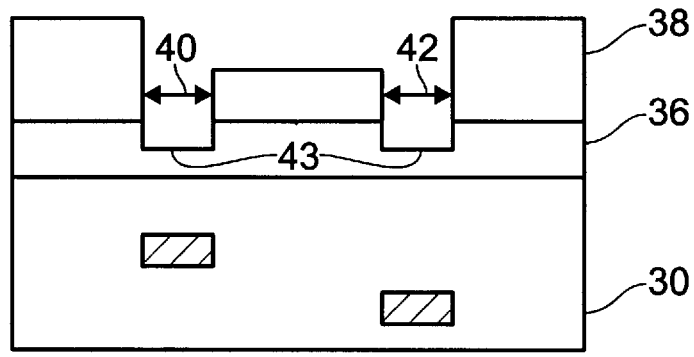
FIG. 12 is a partial cross-sectional view of the IC interlevel dielectric of FIG. 11 with the first surface area of the hard mask layer, underlying the openings in the photoresist profile, removed.
Figure 13:
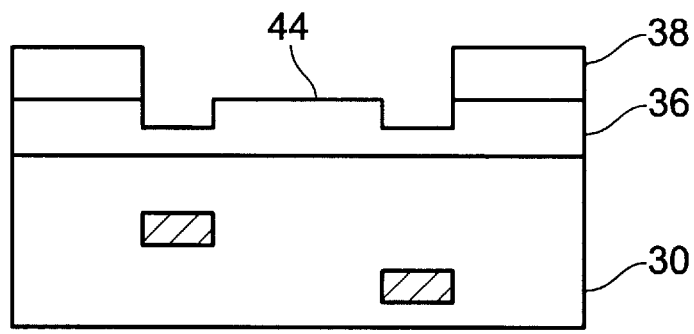
FIG. 13 is a partial cross-sectional view of the IC interlevel dielectric of FIG. 12 with a portion of the photoresist removed to reveal a second hard mask surface area.

FIG. 12 is a partial cross-sectional view of IC interlevel dielectric 30 of FIG. 11 with first surface areas 43 of hard mask layer 36, underlying openings 40 and 42 in photoresist profile 38, removed. FIG. 13 is a partial cross-sectional view of IC interlevel dielectric 30 of FIG. 12 with a portion of photoresist 38 removed to reveal a second hard mask surface area 44.

Figure 14:
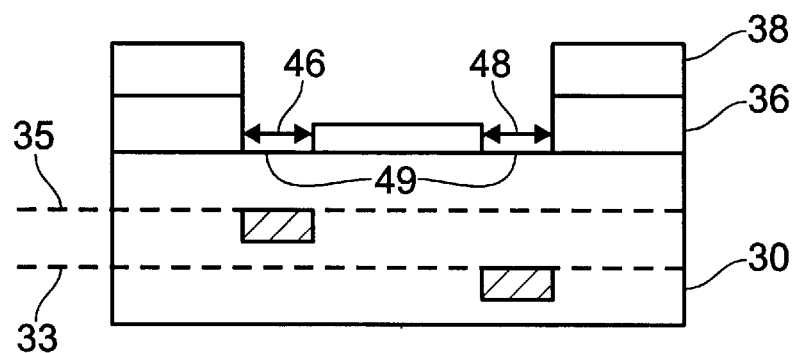
FIG. 14 is a partial cross-sectional view of the IC interlevel dielectric of FIG. 13 with the second surface area of the hard mask layer, underlying the opening in the photoresist, removed.

FIG. 14 is a partial cross-sectional view of IC interlevel dielectric 30 of FIG. 13 with second surface area 44 of hard mask layer 36 removed. At this point in the process a two level profile has been formed in hard mask layer 36. The hard mask profile has a first thickness in the area where hard mask 36 has been partially removed, and a second thickness where hard mask 36 still underlies photoresist 38. In addition, there are two openings 46 and 48 in hard mask 36 revealing a first IC interlevel dielectric surface area 49. The process operates in an equivalent manner when three or more thicknesses are transferred from a photoresist profile to a hard mask. After this step in the process remaining photoresist 38, left overlying hard mask layer 36, is removed.

Figure 15:
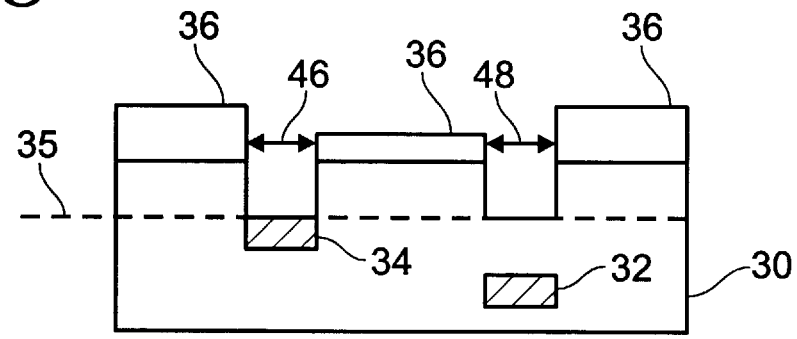
FIG. 15 is a partial cross-sectional view of the IC interlevel dielectric of FIG. 14 with a first surface area of IC material, underlying the opening in the hard mask, removed.

FIG. 15 is a partial cross-sectional view of IC interlevel dielectric 30 of FIG. 14 with first surface area 49 of IC material 30, underlying opening 46 and 48 in hard mask layer 36, removed. The etchant used to remove interlevel dielectric 30 is highly selective to IC material 30, as opposed to hard mask material 36. FIG. 15 shows IC material 30 in opening 46 etched to second interlevel 35. Alternately, interlevel dielectric 30 is etched through openings 46 and 48 to a predetermined interlevel between the surface of dielectric 30 and second interlevel 35.

Figure 16:
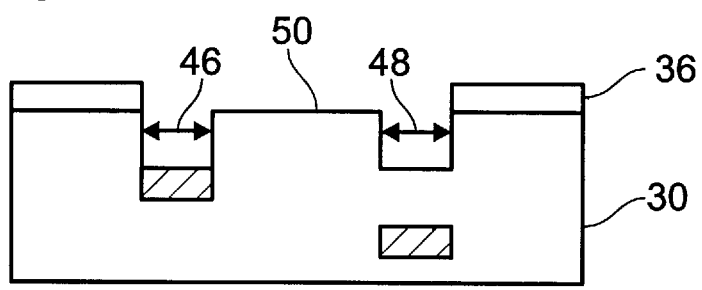
FIG. 16 is a partial cross-sectional view of the IC interlevel dielectric of FIG. 15 with a portion of the hard mask layer removed to reveal a second interlevel dielectric surface area.

FIG. 16 is a partial cross-sectional view of IC interlevel dielectric 30 of FIG. 15 with a portion of hard mask layer 36 removed to reveal a second interlevel dielectric surface area 50.

Figure 17:
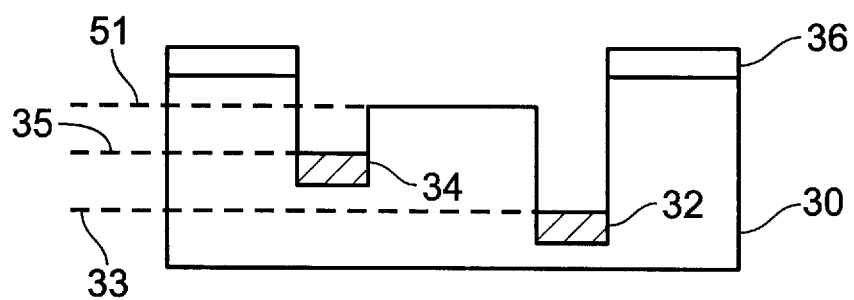
FIG. 17 is a partial cross-sectional view of the IC interlevel dielectric of FIG. 16 with the second surface area of IC material removed.

FIG. 17 is a partial cross-sectional view of IC interlevel dielectric 30 of FIG. 16 with second surface area 50 of IC material 30 removed. Second surface area 50 is etched to a third interlevel 51 to form a trench. As shown in FIG. 17, the etch process into interlevel dielectric 30 begun through opening 48 is continued to form a via to first connection area 32. Alternately, if (in FIG. 16) interlevel dielectric 30 is etched through openings 46 and 48 to a predetermined interlevel, then both vias are continued in FIG. 17 to first connection area 32 and second connection area 34.

Figure 18:
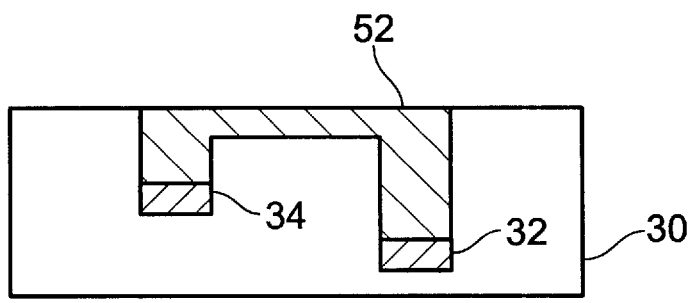
FIG. 18 is a partial cross-sectional view of the IC interlevel dielectric of FIG. 17 with conductive material deposited in the areas where IC material was removed.

FIG. 18 is a partial cross-sectional view of IC interlevel dielectric 30 of FIG. 17 with a conductive material 52 deposited in the areas where IC material 30 was removed. In the example shown in FIG. 18, conductive material 52 is used to electrically connect first connection area 32 to second connection area 34 through the trench at third interlevel 51. Alternately, the same process can be used to electrically interface connections areas at three or more interlevels to form connections between the surface of interlevel dielectric 30 and four or more interlevels.

Figure 19:
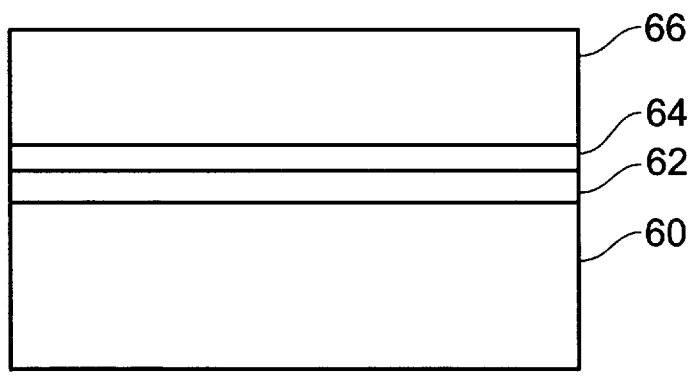
FIG. 19 is a partial cross-sectional view of an IC interlevel dielectric with an overlying first and second hard mask layer, and a layer of photoresist overlying the second hard mask layer.

FIGS. 19–27 depict the formation of interconnections in an interlevel dielectric using a multi-level hard mask profile having two hard mask layers of different materials. FIG. 19 is a partial cross-sectional view of an IC interlevel dielectric 60 with an overlying first 62 and second 64 hard mask layer, and a layer of photoresist 66 overlying second hard mask layer 64.

Figure 20:
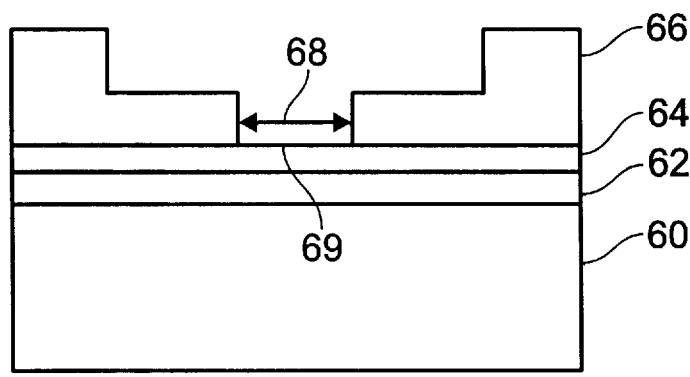
FIG. 20 is a partial cross-sectional view of the IC interlevel dielectric of FIG. 19 with a multi-level pattern formed in the photoresist.

FIG. 20 is a partial cross-sectional view of IC interlevel dielectric 60 of FIG. 19 with a multi-level pattern formed in photoresist 66. The profile of photoresist 66 has two thicknesses and an opening 68 to reveal a first surface area 69 of second hard mask layer 64.

Figure 21:
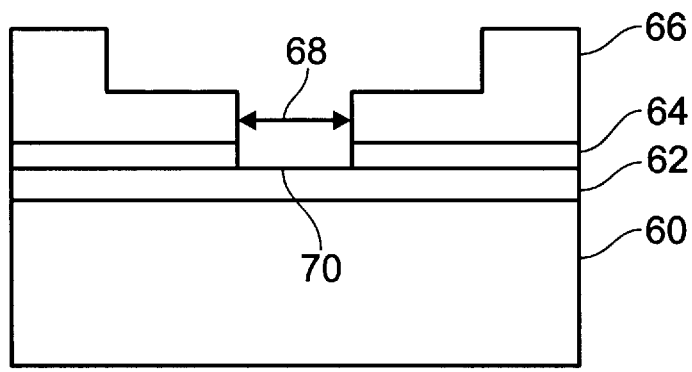
FIG. 21 is a partial cross-sectional view of the IC interlevel dielectric of FIG. 20 with the first surface area of the second hard mask layer, underlying the opening in the photoresist, removed.

FIG. 21 is a partial cross sectional view of IC interlevel dielectric 60 of FIG. 20 with first surface area 69 of second hard mask layer 64, underlying opening 68 in photoresist 66, removed. FIG. 21 shows that second hard mask layer 64 underlying opening 68 has been completely removed to reveal a first surface area 70 of first hard mask layer 62. Alternately, less second hard mask 64 material is removed to reveal a second surface area of second hard mask 64 (not shown). In this manner, second hard mask layer 64 is removed in multiple steps to form a hard mask layer of multiple thicknesses.

Figure 22:
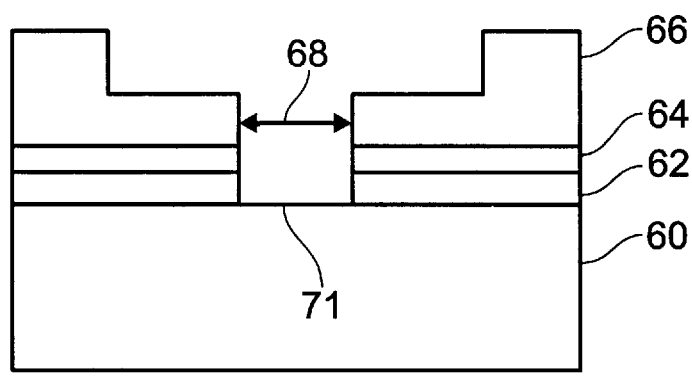
FIG. 22 is a partial cross-sectional view of the IC interlevel dielectric of FIG. 21 with the first surface area of the first hard mask layer, underlying the opening in the second hard mask layer, removed.

FIG. 22 is a partial cross-sectional view of the IC interlevel dielectric 60 of FIG. 21 with first surface area 70 of first hard mask layer 62, underlying opening 68 in second hard mask layer 64, removed. A first IC interlevel dielectric surface area 71 is revealed through the openings in hard masks 62 and 64. One advantage of using different materials for the hard mask layers is that materials with differing etch selectivities can be chosen. That is, the etchant used to remove first hard mask layer 62 has relatively little effect on the second hard mask layer 64, and vice-versa. In this manner, the formation of a multi-level hard mask profile is made easier. In FIG. 22 first hard mask layer 62 underlying opening 68 has been completely removed to reveal first surface area 71. Alternately, less first hard mask material 62 is removed to reveal a second surface area of first hard mask 62 (not shown). In this manner, first hard mask 62 is removed in multiple steps to form a hard mask layer of multiple thicknesses.

Figure 23:
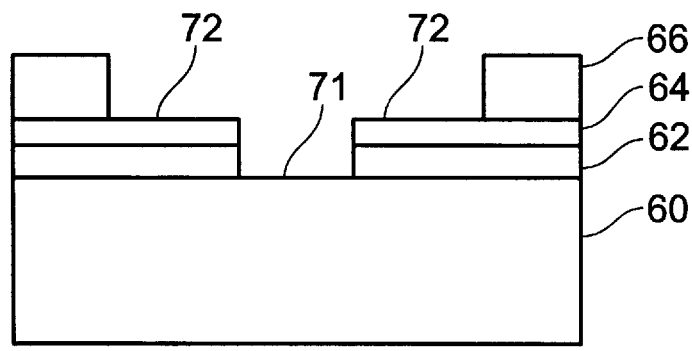
FIG. 23 is a partial cross-sectional view of the IC interlevel dielectric of FIG. 22 with a portion of the photoresist removed to reveal a second surface area of the second hard mask.

FIG. 23 is a partial cross-sectional view of IC interlevel dielectric 60 of FIG. 22 with a portion of photoresist 66 removed to reveal a second surface area 72 of second hard mask 64.

Figure 24:
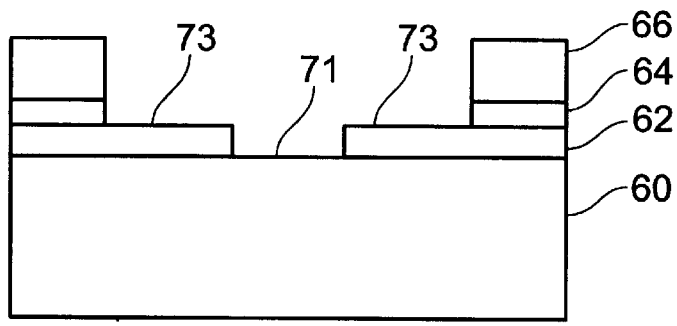
FIG. 24 is a partial cross-sectional view of the IC interlevel dielectric of FIG. 23 with the second surface area of the second hard mask layer, underlying the opening in the photoresist, removed.

FIG. 24 is a partial cross-sectional view of IC interlevel dielectric 60 of FIG. 23 with second surface area 72 of second hard mask layer 64, underlying opening 70 in photoresist 66, removed. The portion of second hard mask layer 64 removed reveals a second surface area 73 of first hard mask layer 62. Alternately, second hard mask 64 is removed in steps to form multiple levels in second hard mask layer 64. FIG. 24 depicts a bilevel hard mask pattern with an opening similar to the single material hard mask profile of FIG. 5. After this step in the process the remaining photoresist 66 overlying second hard mask layer 64 is removed.

Figure 25:
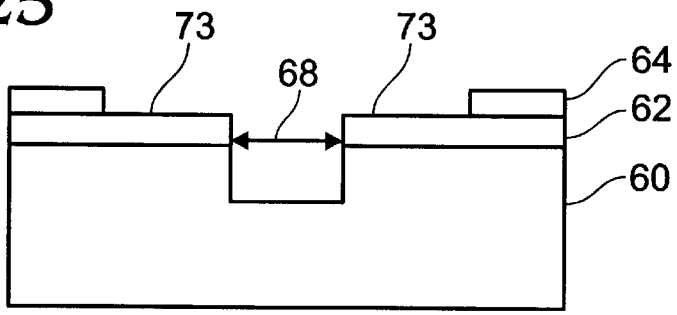
FIG. 25 is a partial cross-sectional view of the IC interlevel dielectric of FIG. 24 with the first surface area of the IC material, underlying the opening in the first hard mask, removed.

FIG. 25 is a partial cross-sectional view of IC interlevel dielectric 60 of FIG. 24 with first surface area 71 of IC material 60, underlying opening 68 in first hard mask 62, removed.

Figure 26:
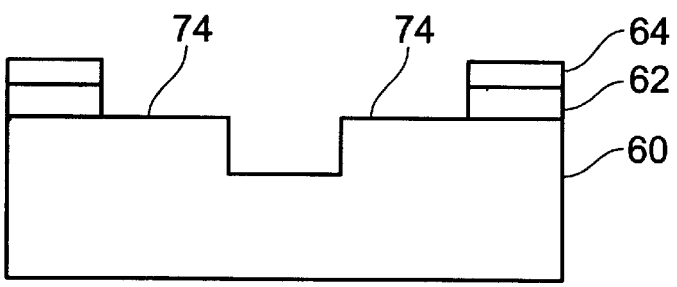
FIG. 26 is a partial cross-sectional view of the IC interlevel dielectric of FIG. 25 with the second surface area of the first hard mask layer removed.

FIG. 26 is a partial cross-sectional view of IC interlevel dielectric 60 of FIG. 25 with second surface area 73 of first hard mask layer 62 removed. The removal of first hard mask layer 62 reveals a second surface area 74 of interlevel dielectric 60. Alternately, first hard mask 62 is removed in steps to form multiple levels in first hard mask layer 62.

Figure 27:
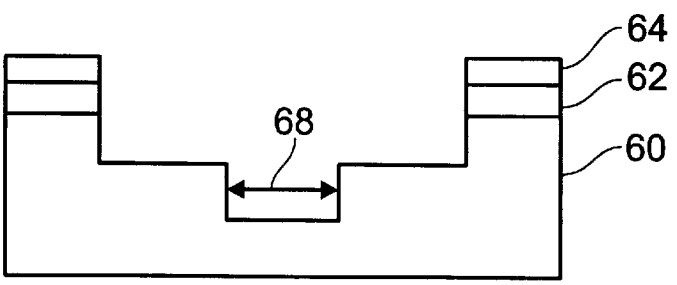
FIG. 27 is a partial cross-sectional view of the IC interlevel dielectric of FIG. 26 with the second surface area of the IC material removed.

FIG. 27 is a partial cross-sectional view of IC interlevel dielectric 60 of FIG. 26 with second surface area 74 of IC material 60, underlying opening 70 in first hard mask layer 62, removed. The end result is that interlevel dielectric 60 has been etched to two different interlevels to resemble the photoresist profile 66. Alternately, the process can be completed by swapping the processes depicted by FIGS. 22 and 23. That is, photoresist 66 may be removed to create opening 70 before first hard mask layer 62 underlying opening 68 is removed.

It is a feature of the invention that a plurality of hard mask layers may be used to create a hard mask profile with a plurality of levels. In this embodiment each hard mask layer corresponds to a hard mask level. Alternately, each hard mask layer may be etched to a plurality of thicknesses. In this manner, a two level hard mask profile has three or more levels to form a dielectric etched to three or more interlevels. A plurality of hard mask materials may be used to ensure highly selective adjoining hard mask layers, or two materials may be just alternated to achieve the same effect.

Figure 28B:
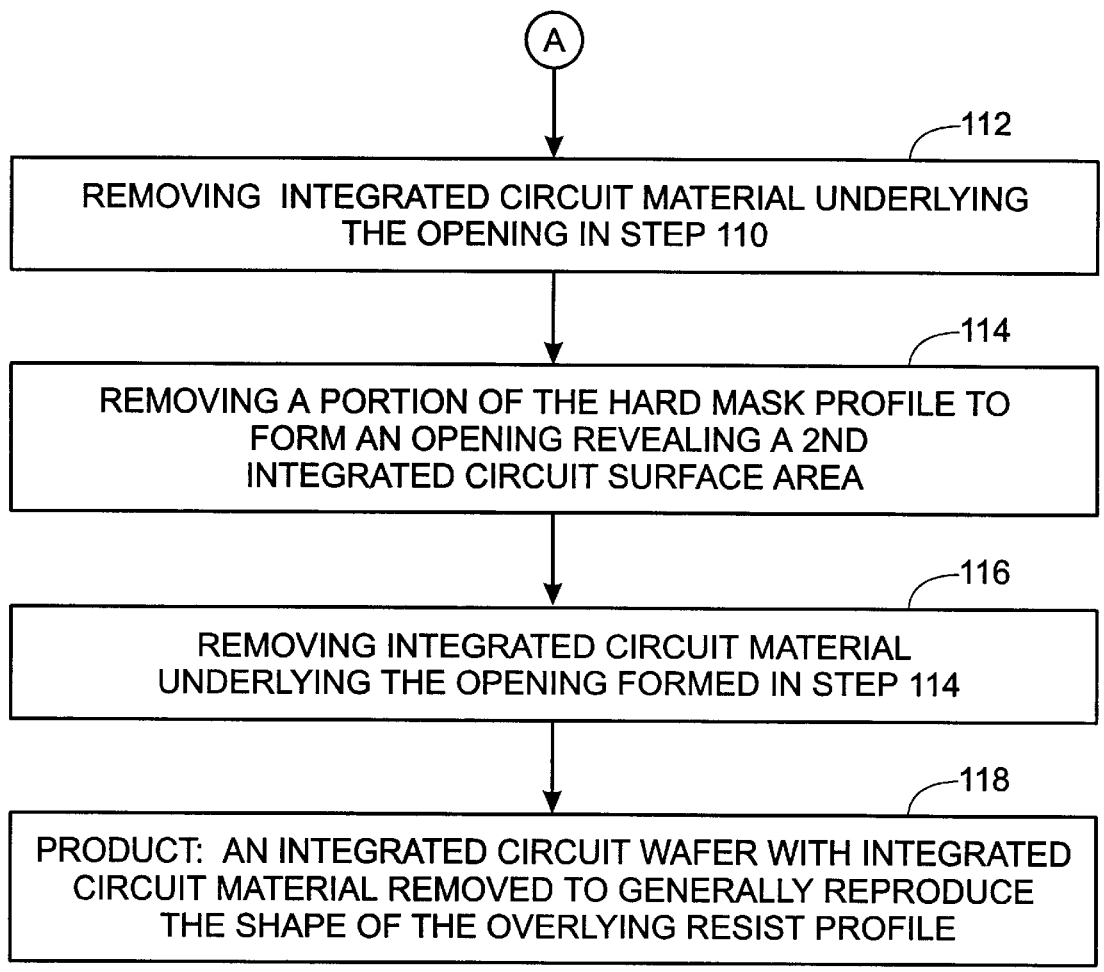
FIG. 28 is a flow diagram illustrating the steps of the method of the present invention for forming electrical interconnections from an IC material surface to a plurality of interlevels in the IC material.

FIG. 28 is a flow diagram illustrating the steps of the method of the present invention for forming electrical interconnections from an integrated circuit material surface to a plurality of interlevels in the integrated circuit material. Step 100 provides an integrated circuit wafer including levels of integrated circuit material having a surface. Step 102 forms a hard mask layer of a predetermined thickness overlying the surface of the integrated circuit material, the hard mask has a surface.

Step 104 forms a resist profile overlooking the hard mask surface, the resist profile has a plurality of predetermined thicknesses, and the resist profile has an opening through the resist profile revealing a first predetermined hard mask surface area. This step in the process generally corresponds to FIG. 2. Step 106 removes a portion of the hard mask layer underlying the opening in the resist profile formed in step 104. Step 106 generally corresponds to FIG. 3.

Step 108 removes a predetermined portion of the resist profile to form an opening revealing a second predetermined hard mask surface area. Step 108 generally corresponds to FIG. 4. Step 110 removes a portion of the hard mask layer underlying the opening formed in step 108 to form a hard mask profile having a plurality of predetermined thicknesses and an opening through the hard mask to reveal a first predetermined integrated circuit surface area. This step in the process generally corresponds to FIG. 5.

Step 112 removes integrated circuit material underlying the opening in the hard mask profile formed in step 110. Step 112 generally corresponds to FIG. 6. Step 114 removes a predetermined portion of the hard mask profile to form an opening revealing a second predetermined integrated circuit surface area. Step 114 generally corresponds to FIG. 7.

Step 116 removes integrated circuit material underlying the opening formed in step 114, and generally corresponds to FIG. 8. Step 118 is the final product, an integrated circuit wafer with integrated circuit material removed to generally reproduce the shape of the overlying resist profile.

In a preferred form of the invention the resist profile formed in step 104 has a first and second thickness with the second thickness being greater than the first thickness. Also, the hard mask profile formed in step 110 has a first and second thickness, with the second thickness being greater than the first thickness. Steps 112 and 116 further include the removal of integrated circuit material to two interlevels with the first interlevel underlying the opening in the hard mask formed in step 110, and a second interlevel underlying the opening in the hard mask formed in step 114, so that the second interlevel is closer to the integrated circuit surface then the first interlevel, whereby a bilevel photoresist profile is transferred, through a hard mask, into interlevels of integrated circuit material.

It is a feature of the method that step 112 includes the removal of integrated circuit material, underlying the opening formed in step 110, to a predetermined interlevel. Also, step 116 includes the removal of integrated circuit material underlying the opening formed in step 114 to the second interlevel, step 116 includes the further removal of integrated circuit material underlying the opening formed in step 110, from the predetermined interlevel of step 112, to the first interlevel, whereby integrated circuit material is removed to three interlevels in two steps of removal. This feature of the invention is generally depicted in FIGS. 11–18.

Alternately, the method of the present invention includes a wafer having connection areas in the integrated circuit at three or more interlevels, and in which steps 112 and 116 include the removal of integrated circuit material for four or more interlevels. That is, the process depicted in FIGS. 11–19 can be used to etch an interlevel dielectric to three or more connection areas in two separate dielectric etch steps (112 and 116) with the use of a bilevel photoresist, and bilevel hard mask profile.

In a preferred embodiment of the invention, the wafer has connection areas in the integrated circuit material at two interlevels, and steps 112 and 116 include the removal of integrated circuit material to three interlevels, as generally depicted in FIG. 17. It is a feature of the process that step 112 includes the removal of integrated circuit material to form a via to a second connection area at a second interval (FIG. 16), and that step 116 includes the further removal of integrated circuit material underlying the opening formed in step 110, to form a via to a first connection area at a first interlevel, and in which step 116 includes the removal of integrated circuit material to form a trench at a third interlevel underlying the opening formed in step 114 (FIG. 17), whereby a bilevel photoresist profile is used to remove integrated circuit material to three interlevels in the integrated circuit wafer.

It is also a feature of the method of the present invention that step 106 includes the removal of hard mask, underlying the opening in the photoresist formed in step 104, to a predetermined thickness. Step 110 includes the removal of hard mask underlying the opening in the photoresist formed in step 108 to a second thickness. Step 110 includes the further removal of hard mask underlying the opening in the photoresist formed in step 104, from the predetermined thickness of step 106, to the first thickness, whereby hard mask is removed to three thicknesses in two steps of removal. In other words, the hard mask removed in step 106 may be removed to a plurality of thicknesses, not necessarily the hard mask first or second thickness.

The preferred embodiment of the present invention includes the step, following step 110, of removing the remaining resist profile left overlying the hard mask surface. The method also includes the steps, following step 116, of; removing the remaining hard mask profile left overlying the surface of the integrated circuit; depositing a conductive material in the areas of the wafer where integrated circuit material is removed in steps 112 and 116 to form electrical interconnect vias to the first and second connection areas from the surface, and depositing a conductive material in the trench formed in step 116 to form a line between the third interlevel and the surface; polishing the surface, including the filled conductive interconnects, to form a planar surface having a predetermined flatness, whereby electrical connections are made to the integrated circuit wafer surface from multiple levels in the wafer. This process is generally depicted in FIG. 18.

It is a feature of the invention that the conductive material is selected from the group consisting of Copper, Tungsten, Aluminum, and Aluminum Alloys. In the preferred embodiment of the invention the conductive material is CVD Copper.

It is a feature of the invention that the hard mask second thickness measures less than ½ of the distance between the integrated circuit wafer surface and the first interlevel in the integrated circuit material. That is, the hard mask profile thickness is less than half the distance between the surface of the interlevel dielectric and the connection area furthest from the interlevel dielectric surface. When photoresist is used overlying the interlevel dielectric to directly etch the dielectric (without a hard mask), the photoresist profile thickness measures one to two times the length of the longest via into the interlevel dielectric. As mentioned earlier, faceting effects degrade the vertical edge of such a photoresist profile resulting, either directly or indirectly, in a degraded vertical edge of an interlevel dielectric via. For this reason, an etch selective mask profile is desirable in etching the interlevel dielectric.

Likewise, in the preferred embodiment of the invention the etch selectivity of the hard mask, or etch selective mask, to the integrated circuit material is higher than four to one. There is a relationship between the selectivity of the hard mask and the hard mask thickness. By choosing a hard mask with a etch selectivity that is high compared to the integrated circuit material, the hard mask can be made thinner. The hard mask material is selected from the group consisting of Silicon Nitride, Poly Silicon, Silicon Dioxide, Amorphous Silicon, and Boron Nitride. Alternately, the hard mask is a conductive material selected from the group consisting Titanium Nitride, Titanium, Tungsten, and Conductive Oxides. Other, unnamed, materials are also suitable for use as a hard mask. The choice of the hard mask is dependent on the interlevel dielectric material, and other materials used in the process.

It is a feature of the invention that step 102 includes forming the hard mask in a plurality of layers using at least two hard mask materials, with each hard mask layer having a predetermined thickness, and the materials of adjoining layers having different etch selectivities, whereby the hard mask profile is formed through removal of hard mask layers in separate etch processes. The shape of the hard mask profile is formed by successively etching each hard mask layer. Since adjoining hard mask layers have different etch selectivities, etch control is simplified. Likewise, instead of alternating hard mask layers between two materials, different materials can be used for each hard mask layer. For example, a hard mask profile of three hard mask layers can be made using three different hard mask materials.

In a preferred embodiment of this invention step 102 includes forming a first hard mask layer overlying the integrated circuit surface, the first hard mask layer having a predetermined thickness and a surface. Step 102 further includes forming a second hard mask layer having a predetermined thickness overlying the first hard mask surface. This hard mask structure is generally depicted in FIG. 19. It is also a feature of the invention that step 110 includes the removal of a portion of the second layer of the hard mask underlying the opening formed in step 108 to form a hard mask profile having a first and second thickness, with the second thickness greater than the first thickness, and in which step 110 includes the formation of a hard mask profile with an opening through all the hard mask layers to reveal the first predetermined surface area of the integrated circuit, whereby a multi-level hard mask profile is formed from multiple hard mask layers (FIG. 24).

It is also a feature of the invention that step 110 includes the removal of a portion of the second hard mask layer so that the hard mask profile first thickness is the first hard mask layer and the hard mask profile second thickness is the combination of all the hard mask layers, and in which step 114 includes the removing of a portion of the first hard mask layer revealed in step 110, to form an opening revealing the first predetermined integrated circuit surface area. Steps 112 and 116 include removal of integrated circuit material to two interlevels with the first interlevel underlying the opening formed in step 110, and a second interlevel underlying the opening formed in step 114, so that the second interlevel is closer to the integrated circuit surface then the first interlevel, whereby the hard mask profile thicknesses correspond to the hard mask layers. The method described above generally corresponds to FIGS. 19 through 27.

FIG. 29 is a flow diagram illustrating the steps of the method of the present invention for etching integrated circuit material. Step 120 provides integrated circuit material having a surface. Step 122 deposits an etch selective mask overlying the surface of the integrated circuit material. Step 124 forms a profile in the mask having a plurality of thicknesses. Step 124 generally corresponds to FIG. 5 (without photoresist 14).

Step 126 etches integrated circuit surface areas exposed through the openings in the mask profile with an etchant selective to the integrated circuit material, if there are openings through the mask profile. Step 128 etches a layer of thickness from the mask profile, with an etchant selective to the mask, to reveal new integrated circuit surface areas. Step 130 repeats steps 126 and 128 until the last layer of mask profile thickness is etched away. Steps 126, 127, and 128 generally correspond to FIGS. 6, 7, and 8 when the mask profile formed in step 124 has two thicknesses. Step 132 is a product, a pattern etched into the integrated circuit material generally resembling the mask profile formed in step 124.

In a preferred form of the invention the mask deposited in step 122 has a surface, and step 124 includes the following steps; 1) depositing a layer of photoresist material overlying the mask surface; 2) forming a profile in the photoresist having a plurality of thicknesses (generally corresponding to FIG. 2); 3) etching mask surface areas exposed through the openings in the photoresist, if there are openings through the photoresist profile; 4) etching a layer of thickness from the photoresist profile to reveal new mask surface areas; and 5) repeating steps 3) and 4) until the last layer of photoresist profile thickness is etched away. Steps 3) through 5) generally correspond to FIGS. 3 through 5 when the photoresist profile formed in step 2) has two thicknesses.

It is a feature of the present invention that the mask deposited in step 122 includes a plurality of mask materials formed in layers, with adjoining mask layers being etch selective (generally corresponding to FIG. 19 in the case of two layers of material). The layer of thickness removed from the mask profile in step 128 is a layer of mask material. In this manner, the mask profile is formed by selectively etching layers of mask material. The differences in etch selectivity between mask layers allow for increased control in the etching process to aid the process of forming the mask profile. FIG. 24 depicts a mask made up of two mask material layers to form a mask profile of two thicknesses.

Figure 30B:
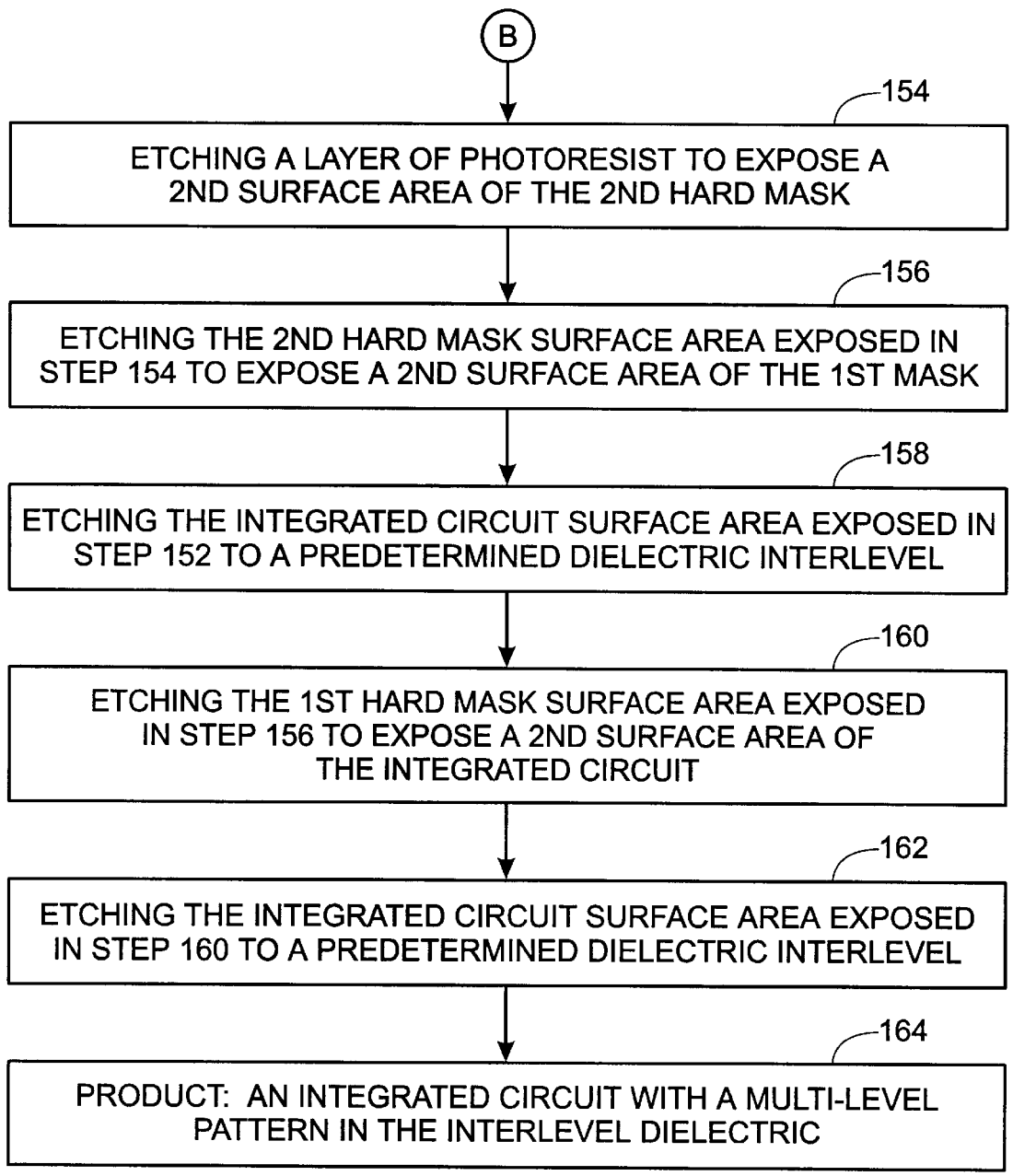
FIG. 30 depicts another flow diagram of the method of the present invention for transferring a photoresist pattern onto an integrated circuit having dielectric interlevels and a surface.

FIG. 30 depicts a flow diagram of the method of the present invention for transferring a photoresist pattern onto an integrated circuit having dielectric interlevels and a surface. Step 140 provides an integrated circuit having dielectric interlevels and a surface. Step 142 deposits a first hard mask layer having a first thickness overlying the integrated circuit surface, the first hard mask layer has a surface. Step 144 deposits a second hard mask layer having a predetermined thickness overlying the first hard mask surface, the second hard mask layer has a surface, and the first and second hard mask layers are selectively etchable. Step 146 deposits a layer of photoresist having a predetermined thickness overlying the second hard mask surface. Steps 140 through 146 are generally depicted by FIG. 19.

Step 148 forms a photoresist pattern having a first thickness less than the photoresist predetermined thickness, and a second thickness greater than the first thickness, the photoresist pattern also has an opening through the photoresist to expose a first surface area of the second hard mask. Step 148 is generally depicted by FIG. 20.

Step 150 etches the second hard mask surface area exposed in step 148 to expose a first surface area of the first hard mask. Step 150 generally corresponds to FIG. 21. Step 152 etches the first hard mask surface area exposed in step 150 to expose a first surface area of the integrated circuit. Step 152 generally corresponds to FIG. 22.

Step 154 etches a layer of photoresist greater than the first thickness, but less than the photoresist second thickness to expose a second surface area of the second hard mask. Step 154 generally corresponds to FIG. 23.

Step 156 etches the second hard mask surface area exposed in step 154 to expose a second surface area of the first hard mask. Step 156 generally corresponds to FIG. 24. Step 158 etches the integrated circuit surface area exposed in step 152 to a predetermined dielectric interlevel. Step 158 generally corresponds to FIG. 25.

Step 160 etches the first hard mask surface area exposed in step 156 to expose a second surface area of the integrated circuit. Step 160 generally corresponds to FIG. 26.

Step 162 etches the integrated circuit surface area exposed in step 160 to a predetermined dielectric interlevel. Step 162 generally corresponds to FIG. 27. It is a feature of the invention that the integrated circuit first etched in step 158 is further etched in step 162. Step 164 is a product, an integrated circuit with a multi-level pattern in the interlevel dielectric.

The method of etching into interlevel dielectric described in FIGS. 2–30, above, generally describe the formation of trench at an intermediate level, and a via (or vias) to interlevels deeper in the dielectric than the trench. Although the above described dielectric structure is a common one for a multi-level damascene process, it is not the only dielectric structure that can be made. The method of the present invention applies equally to any multi-level etching process where faceting, or the degradation of vertical surface profiles, is to be prevented. Modifications and variations within the scope of the present invention will occur to those skilled in the art.

What is claimed is:

1. In an integrated circuit wafer including levels of integrated circuit material having a surface, a method of forming electrical interconnections from the surface to a plurality of interlevels in the integrated circuit material, comprising the steps of:

a) forming a hard mask layer having a thickness overlying the surface of the integrated circuit material, the hard mask having a surface;

b) forming a resist profile overlying the hard mask surface, the resist profile having a plurality of thicknesses, and the resist profile having an opening through the resist profile revealing a first hard mask surface area;

c) removing a portion of the hard mask layer underlying the opening in the resist profile formed in step b);

d) removing a portion of the resist profile to form an opening revealing a second hard mask surface area;

e) removing a portion of the hard mask layer underlying the opening formed in step d) to form a hard mask profile having a plurality of thicknesses and an opening through the hard mask to reveal a first integrated circuit surface area;

f) removing integrated circuit material underlying the opening in the hard mask profile formed in step e);

g) removing a portion of the hard mask profile to form an opening revealing a second integrated circuit surface area; and h) removing integrated circuit material underlying the opening formed in step g), whereby integrated circuit material is removed to generally reproduce the shape of the overlying resist profile.

2. The method as in claim 1 in which the resist profile formed in step b) has a first and second thickness, with the second thickness being greater than the first thickness, and the hard mask profile formed in step e) has a first and second thickness, with the second thickness being greater than the first thickness, and in which steps f) and h) include the removal of integrated circuit material to two interlevels with the first interlevel underlying the opening in the hard mask formed in step e), and a second interlevel underlying the opening in the hard mask formed in step g), so that the second interlevel is closer to the integrated circuit surface than the first interlevel, whereby a bilevel photoresist profile is transferred, through a hard mask, into interlevels of integrated circuit material.

3. The method as in claim 2 in which step f) includes the removal of integrated circuit material, underlying the opening formed in step e), to an interlevel, and in which step h) includes the removal of integrated circuit material underlying the opening formed in step g) to the second interlevel, step h) includes the further removal of integrated circuit material underlying the opening formed in step e), from the interlevel of step f), to the first interlevel, whereby integrated circuit material is removed to three interlevels in two steps of removal.

4. The method as in claim 3 in which step c) includes the removal of hard mask, underlying the opening in the photoresist formed in step b), to a thickness, and in which step e) includes the removal of hard mask underlying the opening in the photoresist formed in step d) to the second thickness, step e) includes the further removal of hard mask underlying the opening in the photoresist formed in step b), from the thickness of step c), to the first thickness, whereby hard mark is removed to three thickness in two steps of removal.

5. The method as in claim 3 wherein the wafer has connection areas in the integrated circuit at three or more interlevels, and in which steps f) and h) include the removal of integrated circuit material to four or more interlevels.

6. The method as in claim 3 in which the wafer has connection areas in the integrated circuit material at two interlevels, and in which steps f) and h) include the removal of integrated circuit material to three interlevels.

7. The method as in claim 6 in which step f) includes the removal of integrated circuit material to form a via to a second connection area at a second interlevel, and in which step h) includes the further removal of integrated circuit material underlying the opening formed in step e), to form a via to a first connection area at a first interlevel, and in which step h) includes the removal of integrated circuit material to form a trench at a third interlevel underlying the opening formed in step g), whereby a bilevel photoresist profile is used to remove integrated circuit material to three interlevels in the integrated circuit wafer.

8. The method as in claim 7 including the step, following step e), of removing the remaining resist profile left overlying the hard mask surface, the method also including the steps, following step h), of:
  i) removing the remaining hard mask profile left overlying the surface of the integrated circuit;
  j) depositing a conductive material in the areas of the wafer where integrated circuit material is removed in steps f) and h) to form electrical interconnect vias to the first and second connection areas from the surface, and depositing a conductive material in the trench formed in step h) to form a line between the third interlevel and the surface; and
  k) polishing the surface, including the filled conductive interconnects, to form a planar surface having a flatness, whereby electrical connections are made to the integrated circuit wafer surface from multiple levels in the wafer.

9. The method as in claim 8 in which the conductive material is selected from the group consisting of Copper, Tungsten, Aluminum, and Aluminum alloys.

10. The method as in claim 8 in which the conductive material is CVD Copper.

11. The method as in claim 2 in which the hard mask second thickness measures less than one half of the distance between the integrated circuit wafer surface and the first interlevel in the integrated circuit material.

12. The method as in claim 1 in which the etch selectivity of the hard mask to the integrated circuit material is higher than four to one.

13. The method as in claim 12 in which the hard mask material is selected from the group consisting of Silicon Nitride, Poly Silicon, Silicon Dioxide, Amorphous Silicon, and Boron Nitride.

14. The method as in claim 12 in which the hard mask is a conductive material selected from the group consisting of Titanium Nitride, Titanium, Tungsten, and Conductive Oxides.

15. The method as in claim 1 in which step a) includes forming the hard mask in a plurality of layers using at least two hard mask materials, with each hard mask layer having a thickness, and the materials of adjoining layers having different etch selectivities, whereby the hard mask profile is formed through removal of hard mask layers in separate etch processes.

16. The method as in claim 15 in which step a) includes forming a first hard mask layer overlying the integrated circuit surface, the first hard mask layer having a thickness and a surface, step a) further includes forming a second hard mask layer having a thickness overlying the first hard mask surface, in which step e) includes the removal of a portion of the second layer of hard mask underlying the opening formed in step d) to form a hard mask profile having a first and second thickness, with the second thickness greater than the first thickness, and in which step e) includes the formation of a hard mask profile with a opening through all the hard mask layers to reveal the first surface area of the integrated circuit, whereby a multi-level hard mask profile is formed from multiple hard mask layers.

17. A method as in claim 16 in which step e) includes the removal of a portion of the second hard mask layer so that the hard mask profile first thickness is the first hard mask layer and the hard mask profile second thickness is the combination of all the hard mask layers, in which step g) includes removing a portion of the first hard mask layer, revealed in step e), to form an opening revealing the first integrated circuit surface area, and in which steps f) and h) include removal of integrated circuit material to two interlevels with the first interlevel underlying the opening formed in step e), and a second interlevel underlying the opening formed in step g), so that the second interlevel is closer to the integrated circuit surface than the first interlevel, whereby the hard mask profile thicknesses correspond to the hard mask layers.

18. A method of etching integrated circuit material having a surface, the method comprising the steps of:
  a) depositing an etch selective mask overlying the surface of the integrated circuit material;
  b) forming a profile in the mask having a plurality of thicknesses;
  c) if there are openings through the mask profile, etching integrated circuit surface areas exposed through the openings in the mask profile with an etchant selective to the integrated circuit material;
  d) etching a layer of thickness from the mask profile, with an etchant selective to the mask, to reveal new integrated circuit surface areas; and
  e) repeating steps c) and d) until the last layer of mask profile thickness is etched away, whereby a pattern is etched into the integrated circuit material generally resembling the mask profile formed in step b).

19. The method as in claim 18 in which the etch selectivity of the mask to the integrated circuit material is higher than four to one.

20. The method as in claim 18 wherein the mask deposited in step a) has a surface, and in which step b) includes the following steps:
  1) depositing a layer of photoresist material overlying the mask surface;
  2) forming a profile in the photoresist having a plurality of thicknesses;

3) if there are any openings through the photoresist profile, etching mask surface areas exposed through the openings in the photoresist;

4) etching a layer of thickness from the photoresist profile to reveal new mask surface areas;

5) repeating steps 3) and 4) until the last layer of photoresist profile thickness is etched away, whereby a profile is etched into the mask generally resembling the photoresist profile formed in step 2).

21. The method as in claim 18 in which the mask deposited in step a) includes a plurality of mask materials formed in layers, with adjoining mask layers being etch selective, and in which the layer of thickness removed from the mask profile in step d) is a layer of mask material, whereby the mask profile is formed by selectively etching layers of mask material.

22. A method for transferring a photoresist pattern onto an integrated circuit having dielectric interlevels and a surface, the method comprising the steps of:

a) depositing a first hard mask layer having a first thickness overlying the integrated circuit surface, the first hard mask layer having a surface;

b) depositing a second hard mask layer having a thickness overlying the first hard mask surface, the second hard mask layer having a surface, and the first and second hard mask layers being selectively etchable;

c) depositing a layer of photoresist having a thickness overlying the second hard mask surface;

d) forming a photoresist pattern having a first thickness less than the photoresist thickness, and a second thickness greater than the first thickness, the photoresist pattern also having an opening through the photoresist to expose a first surface area of the second hard mask;

e) etching the second hard mask surface area exposed in step d) to expose a first surface area of the first hard mask;

f) etching the first hard mask surface area exposed in step e) to expose a first surface area of the integrated circuit;

g) etching a layer of photoresist greater than the first thickness, but less than the photoresist second thickness to expose a second surface area of the second hard mask;

h) etching the second hard mask surface area exposed in step g) to expose a second surface area of the first hard mask;

i) etching the integrated circuit surface area exposed in step f) to a dielectric interlevel;

j) etching the first hard mask surface area exposed in step h) to expose a second surface area of the integrated circuit; and k) etching the integrated circuit surface area exposed in step j) to a dielectric interlevel, whereby a bilevel photoresist pattern is transferred to a bilevel hard mask, and the bilevel hard mask is used to form a multi-level pattern in the interlevel dielectric.

* * * * *